(12) United States Patent
Sugizaki (10) Patent No.: US 7,443,722 B2
(45) Date of Patent: Oct. 28, 2008

(54) SEMICONDUCTOR DEVICE AND DRIVING METHOD THEREFOR

(75) Inventor: Taro Sugizaki, Kanagawa (JP)

(73) Assignee: Sony Corporation (JP)

( * ) Notice: Subject to any disclaimer, the term of this patent is extended or adjusted under 35 U.S.C. 154(b) by 2 days.

(21) Appl. No.: 11/808,821

(22) Filed: Jun. 13, 2007

(65) Prior Publication Data

US 2008/0002463 A1    Jan. 3, 2008

(30) Foreign Application Priority Data

Jun. 30, 2006   (JP)   ............................ P2006-180687

(51) Int. Cl.
*G11C 11/34* (2006.01)

(52) U.S. Cl. .................... 365/177; 365/185.27; 257/107

(58) Field of Classification Search ................ 365/177, 365/180, 185.27, 63, 174, 204, 205, 207; 257/133, 107

See application file for complete search history.

(56) References Cited

U.S. PATENT DOCUMENTS 5,268,587 A *   12/1993   Murata et al. ............... 257/357
6,462,359 B1    10/2002   Nemati et al.
2007/0189067 A1 *   8/2007   Goodwin ..................... 365/180

OTHER PUBLICATIONS

Farid Nemati and James D. Plummer, "A Novel High Density, Low Voltage SRAM Cell with a Vertical NDR Device", 1998 IEEE, VLSI Technology Tech. Dig. p. 66 1998.
Farid Nemati and James D. Plummer A Novel Thyristor-based SRAM Cell (T-RAM) for High-Speed, Low-Voltage, Giga-scale Memories, 1999 IEEE IEDM Tech., p. 283 1999.
Farid Nemati, Hyun-Jin Cho, Scott Robins, etc. "Fully Planar 0.562μm2 T-RAM Cell in a 130nm SOI CMOS Logic Technology for High-Density High-Performance SRAMS" 2004 IEEE IEDM Tech., p. 273 2004.

* cited by examiner

*Primary Examiner*—Dang T Nguyen
(74) *Attorney, Agent, or Firm*—Rader Fishman & Grauer PLLC; Ronald P. Kananen

(57) ABSTRACT

A semiconductor device includes a bulk semiconductor substrate, a plurality of storage elements, a bit line, a first voltage being applied to the first region side of the thyristor, and a voltage lower than the first voltage being applied to a word line. The plurality of storage elements formed on the bulk semiconductor substrate and each including a thyristor formed on the bulk semiconductor substrate and including a first region of a first conductor type, a second region of a second conduction type opposite to the first conduction type, a third region of the first conduction type and a fourth region of the second conduction type jointed together in order, a gate electrode formed on the third region, and a field effect transistor formed on the semiconductor substrate on which the thyristor is formed and connected to the fourth region of the thyristor.

8 Claims, 12 Drawing Sheets

ON STATE

FIG.7C

OF STATE

SEMICONDUCTOR DEVICE AND DRIVING METHOD THEREFOR

CROSS REFERENCES TO RELATED APPLICATIONS

The present invention contains subject matter related to Japanese Patent Application JP 2006-180687 filed with the Japan Patent Office on Jun. 30, 2006, the entire contents of which being incorporated herein by reference.

BACKGROUND OF THE INVENTION

1. Field of the Invention

This invention relates to a semiconductor device which switches at a high speed from an on state to an off state and a driving method for the semiconductor device.

2. Description of the Related Art

A memory has been proposed wherein a thyristor is used such that the turn-on and turn-off characteristics of the thyristor are controlled through a gate electrode implemented thereon and the thyristor is connected in series to an access transistor. The memory of the type described is suitable for an SRAM (Static Random Access Memory) and is hereinafter referred to as T-RAM. In a memory operation of the T-RAM, the off region of the thyristor is represented by "0" and the off region of the thyristor is represented by "1".

The thyristor has such a basic structure that a p-type region p1, an n-type region n1, another p-type region p2 and another n-type region n2 joined together in this order and, for example, n-type silicon and p-type silicon are laminated in four layers. In the following description, the basic structure described is represented by p1/n1/p2/n2. Two different structures have been proposed by T-RAM, Inc. One of the structures includes the p1/n1/p2/n2 structure formed vertically on a silicon substrate. Meanwhile, the other one of the structures includes the p1/n1/p2/n2 structure formed transversely on a silicon layer using a SOI substrate. In both configurations, a gate electrode having a MOS structure is provided on the p-type region p2 to achieve high speed operation.

Figure 7A:
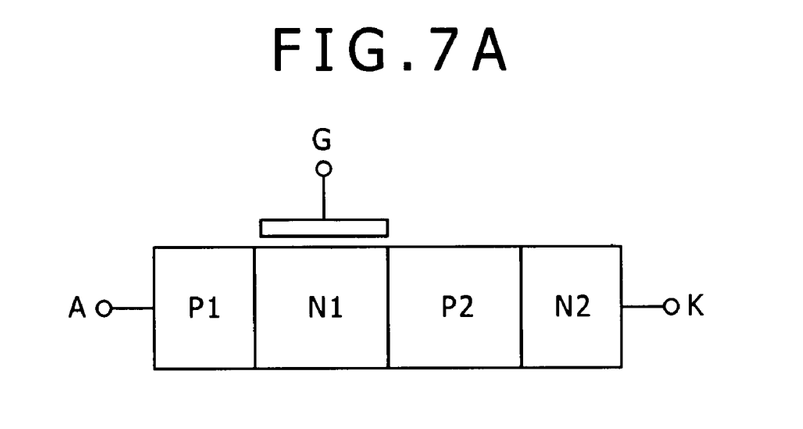
FIGS. 7A to 7C are schematic views illustrating a configuration and different operations of an existing semiconductor device of the thyristor configuration.

For example, as seen in FIG. 7A, a semiconductor device of the thyristor configuration includes a first p-type region p1, a first n-type region n1, a second p-type region p2 and a second n-type region n2 provided in order in four layers to obtain the p1/n1/p2/n2 structure. An anode electrode A is connected to the first p-type region p1 at one end of the semiconductor device while a cathode electrode K is connected to the second n-type region n2 provided at the opposite end of the semiconductor device. Further, a gate electrode G is disposed on the second p-type region p2 disposed on the inner side. Such a thyristor as described above may have a configuration wherein the p1/n1/p2/n2 structure is provided vertically on a surface layer of a silicon substrate or another configuration wherein the p1/n1/p2/n2 structure is provided transversely.

Figure 7B:
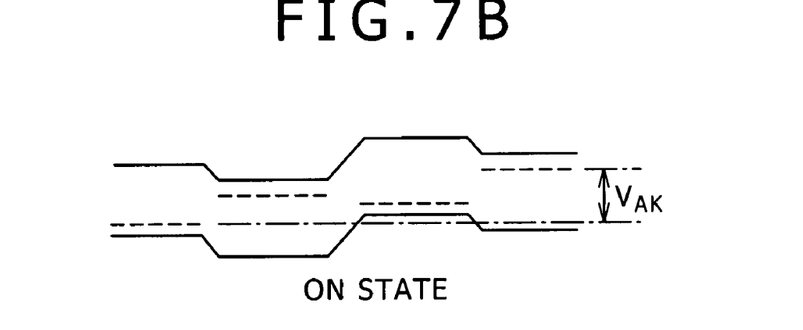

In the semiconductor device of the thyristor configuration described above, if a forward bias is applied between the anode electrode A and the cathode electrode K as seen in FIG. 7B, then holes are supplied from the first p-type region p1 connected to the anode electrode A to the first n-type region n1 while electrons are supplied from the second n-type region n2 connected to the cathode electrode K to the second p-type region p2. Then, the holes and the electrodes are re-coupled at the joining portion between the n-type region n1 and the p-type region p2, and electric current flows thereby and the semiconductor device is placed into an on state.

Figure 7C:
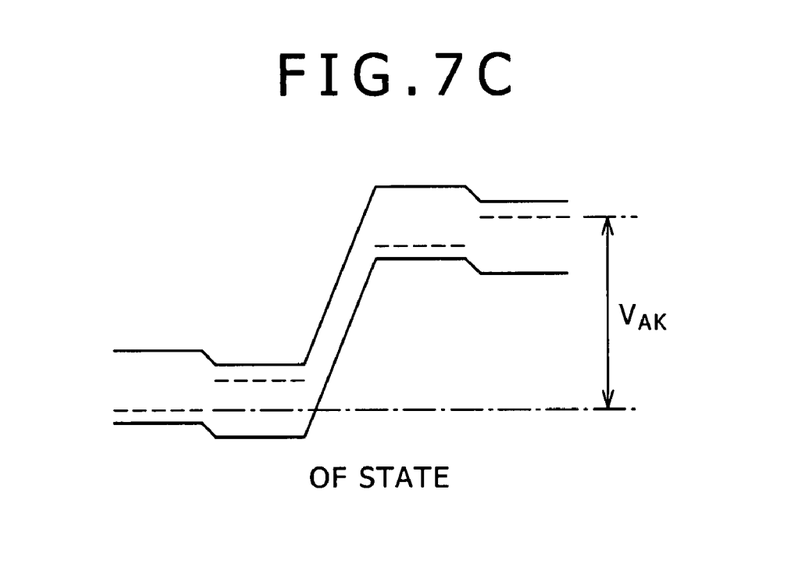

On the other hand, if a reverse bias is applied between the anode electrode A and the cathode electrode K as seen in FIG. 7C, then the semiconductor device is placed into an off state. However, a period of time of approximately several ms may be required until a substantial off state is reached. In other words, if the semiconductor device is placed into an on state once, then it does not place itself into an off state spontaneously only if a reverse bias is applied between the anode electrode A and the cathode electrode K. Thus, the current is reduced to a level below the holding current or the power supply is disconnected thereby to sweep out or re-couple excessive carriers flowing to the n-type region n1 and the p-type region p2.

Therefore, in order to change over the semiconductor device from an on state to an off state, a negative voltage is applied to the anode electrode A while a positive voltage is applied to the cathode electrode K to establish a reverse bias state. However, only with this, a period of time of approximately several ms may be still required.

Figure 8:
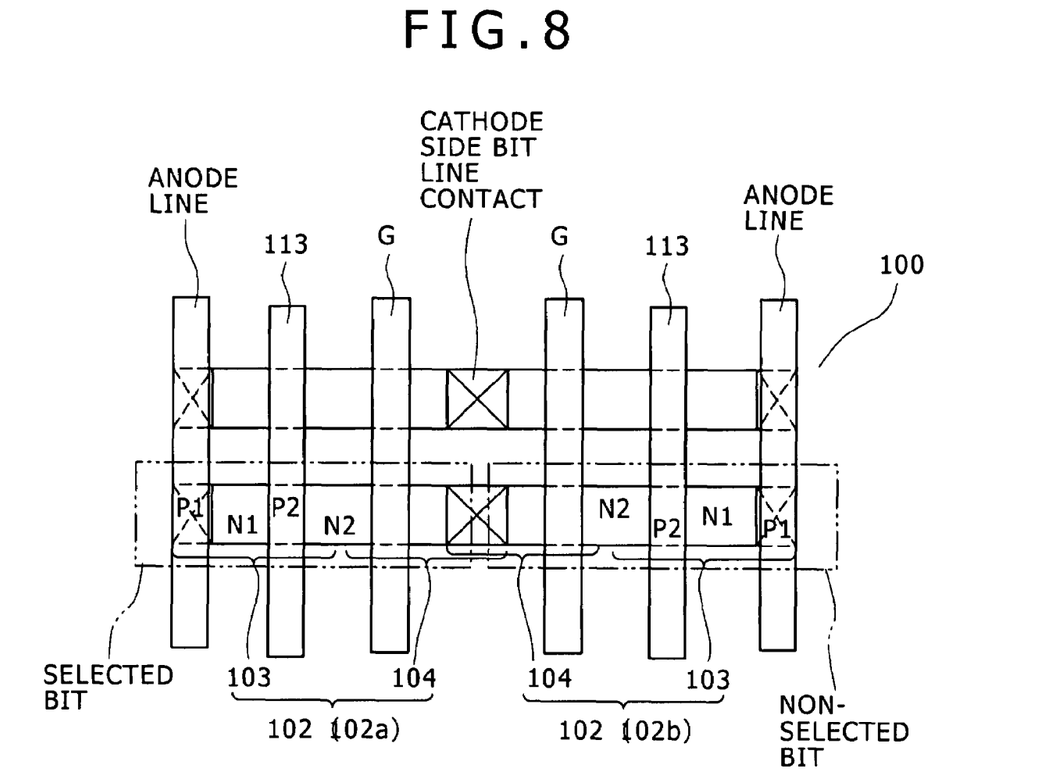
FIG. 8 is a schematic view showing a layout of an example of an existing semiconductor device.

Here, an example of an existing cell array is described with reference to FIG. 8. As seen in FIG. 8, storage elements 102 are arrayed, for example, in a matrix on a SOI substrate 100. The storage elements 102 include a thyristor 103 having such a configuration which includes a gate electrode G as described hereinabove with reference to FIG. 7A and a field effect transistor 104 are connected in series. Now, it is assumed that, from between two storage elements 102 connected to the same bit line (not shown), one storage elements 102 (102a) corresponds to a selected bit while the other storage element 102 (102b) corresponds to a non-selected bit. Upon turning off operation, that is, upon "Write 0" operation, while a voltage in a reverse bias condition is applied simultaneously from a bit line contact of the cathode side to the storage element 102a of the selected bit connected to the bit line (not shown), no voltage is applied to the thyristor gate 113 of the storage element 102b of the non-selected bit. Therefore, the turning off speed of the non-selected bit is very low, and consequently, only the selected bit can be turned off.

Figure 9A:
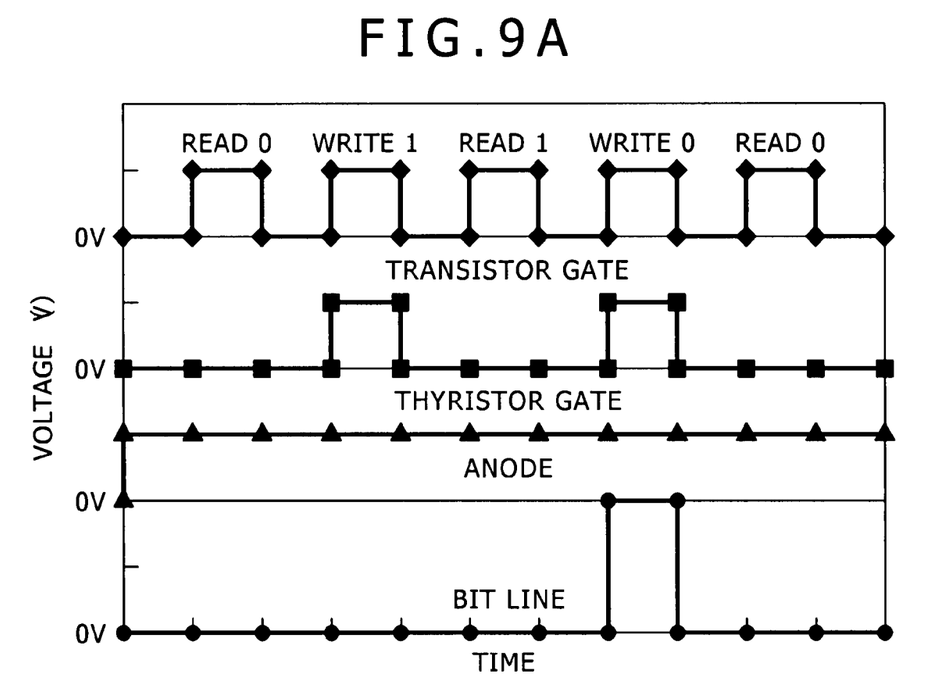
FIGS. 9A and 9B are timing charts of pulses of an existing semiconductor device of the thyristor configuration which uses a SOI substrate.
Figure 9B:
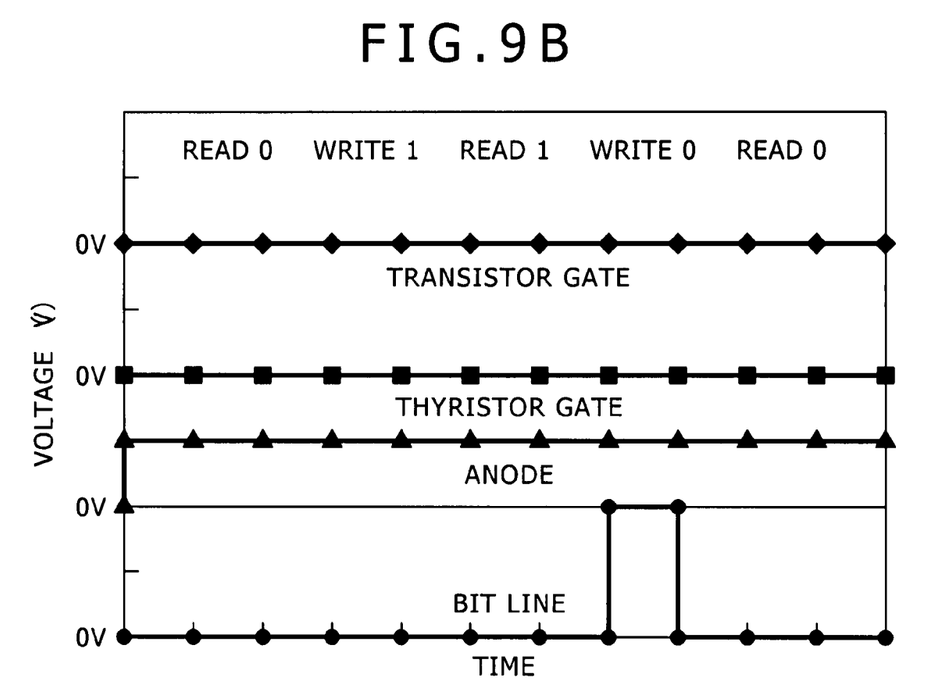

As seen from a pulse timing chart of FIG. 9, a voltage is applied to the gate electrode (thyristor gate) provided on the p-type region p2 so that an electric field is generated in the p-type region p2 to cause electrons as excessive carries to be discharged compulsorily thereby to place the semiconductor device into a substantial off state as quickly as possible. In this instance, high speed operation of several ns can be achieved.

Meanwhile, also a configuration called GTO (Gate Turnoff Thyristor) wherein such a gate electrode as described above contacts directly with a p-type region is available. The configuration which includes a MOS electrode is a modification to the GTO configuration, and the role of the electrode therein is same.

However, where a bulk silicon wafer is used, since the p-type region p2 extends deeply in the depthwise direction of the substrate, the bias from the gate electrodes reaches only part of the layer of the p-type region p2. Therefore, even if a bias is applied from the gate electrode, the effect of it is restricted, and it is difficult to separate the selected bit and non-selected bit from each other to prevent disturbance.

Now, a relationship between the voltage $V_{AK}$ between the anode electrode A and the cathode electrode K in a semiconductor device of the thyristor configuration described above and current I flowing through the semiconductor device is described with reference to FIG. 10.

Figure 10:
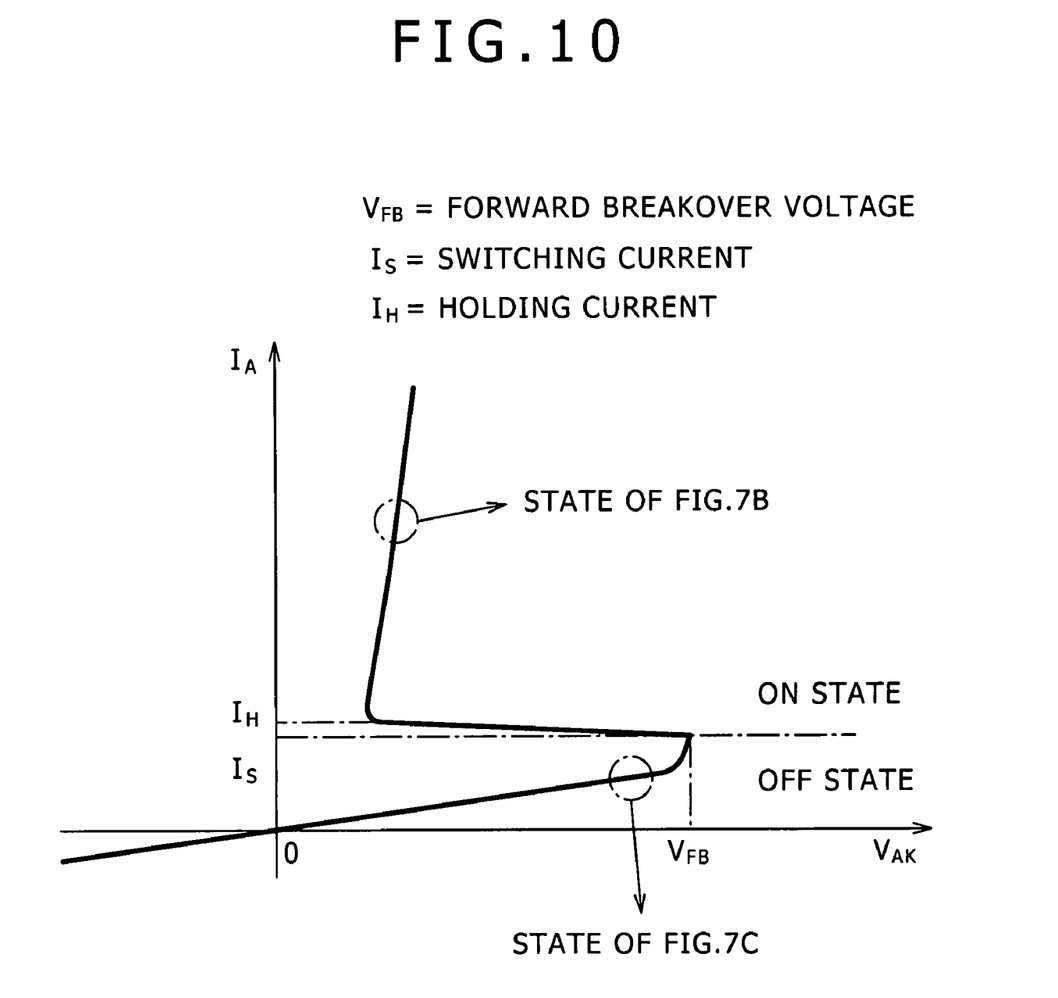
FIG. 10 is a diagram illustrating a voltage-current (V-I) characteristic of an existing semiconductor device of the thyristor configuration.

If an increasing positive voltage is applied to the anode electrode A as seen in FIG. 10, then when the voltage $V_{AK}$ reaches a critical voltage $V_{FB}$, the pn junction between the n-type region n1 and the p-type region p2 is subject to a forward bias, and the voltage $V_{AK}$ drops and current higher than holding current $I_H$ begins to flow. However, before the critical voltage $V_{FB}$ is reached, only switching current $I_S$ lower than the holding current $I_H$ flows, and when the critical voltage $V_{FB}$ is exceeded, higher current than the holding current $I_H$ begins to flow.

Various configurations have been proposed wherein a gate electrode is formed in a MOS structure wherein an electrode is disposed on the p-type region p2 with an insulating layer interposed therebetween in order to speed up such switching operation as described above. Such configurations are disclosed, for example, in U.S. Pat. No. 6,462,359 (B1), Farid Nemati and James D. Plummer, "A Novel High Density, Low Voltage SRAM Cell with a Vertical NDR Device", 1998 IEEE, VLSI Technology Tech. Dig., P. 66, 1998, Farid Nemati and James D. Plummer, "A Novel Thyristor-Based SRAM Cell (T-RAM) for High-Speed, Low-Voltage, Giga-Scale Memories", 1999 IEEE IEDM Tech., p. 283, 1999 and Farid Nemati, Hyun-Jin Cho, Scott Robins, Rajesh Gupta, Marc Tarabbia, Kevin J. Yang, Dennes Hayes, and Vasudenvan Gopalakrishnan, "Fully Planar 0.562 µm² T-RAM Cell in a 130 nm SOI CMOS Logic Technology for High-Density High-Performance SRAMS", 2004 IEEE IDEM Tech., p. 273, 2004.

SUMMARY OF THE INVENTION

As described above, semiconductor devices of the type described above have a problem that, where a bulk silicon wafer is used to form a cell array, a non-selected cell suffers from disturbance from a bit line (or anode line) upon turning from an on state to an off state.

Therefore, it is demanded to provide a semiconductor device which switches at a high speed from an on state to an off state even where the semiconductor device is configured using a bulk semiconductor substrate and a driving method for the semiconductor device. According to an embodiment of the present invention, in order to achieve such high speed switching, a selected cell and a non-selected cell are distinguished from each other, and only the selected cell is turned off.

More particularly, according to an embodiment of the present invention, there is provided a semiconductor device including a bulk semiconductor substrate, a plurality of storage elements formed on the bulk semiconductor substrate and each including a thyristor formed on the bulk semiconductor substrate and having a first region of a first conductor type, a second region of a second conduction type opposite to the first conduction type, a third region of the first conduction type and a fourth region of the second conduction type jointed together in order, a gate electrode formed on the third region, and a field effect transistor formed on the semiconductor substrate on which the thyristor is formed and connected to the fourth region of the thyristor, and a bit line connected to the cathode of the field effect transistor, a first voltage being applied, upon turning off operation of a selected one of the storage elements, to the first region side of the thyristor of the selected storage element while a second voltage higher than the first voltage is applied to the cathode side of the field effect transistor of the selected storage element, a voltage lower than the first voltage being applied to a word line formed for the field effect transistor of a non-selected one of the storage elements connected to the bit line connected to the selected storage element.

In the semiconductor device, when the selected storage element (selected cell) is to perform a turning off operation, the second voltage to be applied to the bit line (cathode side) is set higher than the first voltage to be applied to the first region (anode side) of the thyristor. Besides, a positive bias is applied to the gate of the field effect transistor (selected transistor) to turn on the channel so that excessive carriers are swept out rapidly. On the other hand, a voltage lower than the first voltage, for example, where the first voltage is set to a positive voltage, a voltage for placing the field effect transistor into an on state, or a negative voltage, is applied to the word line (gate) for the field effect transistor (selected transistor) of the non-selected storage element (non-selected cell) so that the channel of the field effect transistor is placed into a fully off state. Consequently, a reverse bias voltage from the bit line is prevented from being applied to the thyristor and excessive carries are confined, and therefore, on-information is maintained.

With the semiconductor device, there is an advantage that, even if the gate of the thyristor is not used, a selected cell and a non-selected cell can be distinguished from each other upon turning off operation, and it is possible to prevent disturbance from a bit line or an anode line and prevent erroneous writing into the non-selected cell. Consequently, the semiconductor device has a high degree of reliability.

According to another embodiment of the present invention, there is provided a driving method for a semiconductor device which includes a bulk semiconductor substrate, a plurality of storage elements formed on the bulk semiconductor substrate and each including a thyristor formed on the bulk semiconductor substrate and including a first region of a first conductor type, a second region of a second conduction type opposite to the first conduction type, a third region of the first conduction type and a fourth region of the second conduction type jointed together in order, a gate electrode formed on the third region, and a field effect transistor formed on the semiconductor substrate on which the thyristor is formed and connected to the fourth region of the thyristor, including the steps of, a bit line being connected to the cathode of the field effect transistor, applying, upon turning off operation of a selected one of the storage elements, a first voltage to the first region side of the thyristor of the selected storage element while a second voltage higher than the first voltage is applied to the cathode side of the field effect transistor of the selected storage element, and applying a voltage lower than the first voltage to a word line formed for the field effect transistor of a non-selected one of the storage elements connected to the bit line connected to the selected storage element.

In the driving method for the semiconductor device, when the selected storage element (selected cell) is to perform a turning off operation, the second voltage to be applied to the bit line (cathode side) is set higher than the first voltage to be applied to the first region (anode side) of the thyristor. Besides, a positive bias is applied to the gate of the field effect transistor (selected transistor) to turn on the channel so that excessive carriers are swept out rapidly. On the other hand, a voltage lower than the first voltage, for example, where the first voltage is set to a positive voltage, a voltage for placing the field effect transistor into an on state, or a negative voltage, is applied to the word line (gate) for the field effect transistor (selected transistor) of the non-selected storage element (non-selected cell) so that the channel of the field effect transistor is placed into a fully off state. Consequently, a reverse bias voltage from the bit line is prevented from being applied to the thyristor and excessive carriers are confined, and therefore, on-information is maintained.

With the driving method for the semiconductor device, there is an advantage that, even if the gate of the thyristor is not used, a selected cell and a non-selected cell can be distinguished from each other upon turning off operation, and it is possible to prevent disturbance from a bit line or an anode line and prevent erroneous writing into the non-selected cell. Consequently, the semiconductor device has a high degree of reliability.

The above and other desire, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

First, a storage element used in a semiconductor device to which the present invention is applied is described with reference to FIG. 2.

A storage element 2 of a semiconductor device 1 includes a thyristor 3 which in turn includes a first region (hereinafter referred to as first p-type region) p1 of a first conduction type (hereinafter referred to as p type). The thyristor 3 further includes a second region (hereinafter referred to as first n-type region) n1 of a second conduction type (hereinafter referred to as n type) opposite to the first conductor type. The thyristor 3 further includes a third region (hereinafter referred to as second p-type region) p2 of the first conduction type (p type) and a fourth region (hereinafter referred to as second n-type region) n2 of the second conduction type (n type). The first p-type region p1, first n-type region n1, second p-type region p2 and second n-type region n2 are joined together in order.

Element formation regions are defined by element separation regions 31 on a bulk semiconductor substrate 10, and well regions 11 of the second conduction type (n type) are formed on the bulk semiconductor substrate 10 on which thyristors are to be formed. An upper layer of the well regions 11 is formed in a region of the first conduction type (p type) and forms the second p-type region p2 of a thyristor. The bulk semiconductor substrate 10 may be formed typically from a bulk silicon substrate. The second p-type region p2 is formed by introducing boron (B) as a p-type dopant in a dopant concentration of approximately $5 \times 10^{18}$ cm$^{-3}$. Although the dopant concentration of the second p-type region p2 preferably ranges from approximately $1 \times 10^{18}$ cm$^{-3}$ to approximately $1 \times 10^{19}$ cm$^{-3}$, basically it is necessary for the dopant concentration of the second p-type region p2 to be lower than the dopant concentration of the first n-type region n1 of the second conduction type (n type) hereinafter described. Further, the p-type dopant may not be boron (B) but may be a p-type impurity such as indium (In).

A gate electrode 13 is formed on the second p-type region p2 with a gate insulating film 12 interposed therebetween. A hard mask (not shown) may be formed on the gate electrode 13. The gate insulating film 12 is formed typically from a silicon oxide (SiO$_2$) film and has a thickness of approximately 1 nm to 10 nm. It is to be noted that the gate insulating film 12 may not be formed from silicon oxide (SiO$_2$) but may be made of silicon nitride oxide (SiON) or any gate insulating film material which can be applied to ordinary CMOS transistors such as hafnium oxide (HfO$_2$), hafnium nitride oxide (HfON), aluminum oxide (Al$_2$O$_3$), hafnium silicate (HfSiO), hafnium nitride silicate (HfSiON) and lanthanum oxide (La$_2$O$_3$).

The gate electrode 13 is normally formed from polycrystalline silicon. Or the gate electrode 13 may be formed as a metal gate electrode or may be formed from silicon germanium (SiGe). Or, a hard mask used upon formation of the gate electrode 13 may be left on the gate electrode 13. This hard mask is formed typically from a silicon oxide (SiO$_2$) film or a silicon nitride (Si$_3$N$_4$) film.

Side walls 15 and 16 are formed on the opposite side faces of the gate electrode 13. The side walls 15 and 16 are made of silicon oxide (SiO$_2$) or silicon nitride (Si$_3$N$_4$) or formed from a laminated film of the substances. Further, a salicide block 17 to be used in a salicide process is formed over an area from the first n-type region n1 to the gate electrode 13.

The first n-type region n1 of the second conduction type (n type) to be joined to the second p-type region p2 is formed on the bulk semiconductor substrate 10 on one side of the gate electrode 13. The first n-type region n1 is formed, for example, by introducing phosphorus (P) of an n-type dopant so that the dopant concentration may be, for example, $1.5 \times 10^{19}$ cm$^{-3}$. Although this dopant concentration preferably is approximately $1 \times 10^{18}$ cm$^{-3}$ to $1 \times 10^{21}$ cm$^{-3}$, it is necessary for the dopant concentration to be higher than the dopant concentration of the second p-type region p2. Also it is possible to use another n-type dopant such as arsenic or antimony in place of phosphorus.

On the bulk semiconductor substrate 10 on the other side of the gate electrode 13, the second n-type region n2 of the second conduction type (n type) to be joined to the second p-type region p2 is formed. This second n-type region n2 is formed, for example, by introducing arsenic (As) of an n-type dopant so that the dopant concentration may be, for example, $1 \times 10^{19}$ cm$^{-3}$. This dopant concentration preferably is approximately $1 \times 10^{18}$ cm$^{-3}$ to $1 \times 10^{21}$ cm$^{-3}$. However, it is necessary for the dopant concentration to be higher than the dopant concentration of the second p-type region p2. Also it is possible to use another n-type dopant such as phosphorus or antimony in place of arsenic.

Further, the first p-type region p1 of the first conduction type (p type) is formed on the first n-type region n1. The first p-type region p1 is formed such that the boron (B) concentration in the film is, for example, $1 \times 10^{20}$ cm$^{-3}$. The dopant (boron) concentration preferably is approximately $1 \times 10^{18}$ cm$^{-3}$ to $1 \times 10^{21}$ cm$^{-3}$.

Further, the anode side is connected to the first p-type region p1 while the cathode side is connected to the second n-type region n2. The anode is connected to an anode line AL.

The anode line AL is connected, for example, to a power supply voltage VDD. However, when data is to be read out from the anode line AL side, the anode line AL is not connected to the power supply voltage VDD. Further, though not shown, silicide (titanium silicide, cobalt silicide, nickel silicide or the like) is formed on the first p-type region p1, second n-type region n2 and gate electrode 13.

In the semiconductor device 1, a first voltage is applied to the first p-type region p1 side of the thyristor 3 and a second voltage higher than the first voltage is applied to the second n-type region n2 side while a voltage higher than the first voltage is applied to the well region 11. The voltage applied to the well region 11 is lower than the second voltage. For example, the well region 11 is connected to a ground GND (−1 V to 1 V).

In the semiconductor device 1, the first p-type region p1 may be formed, for example, by epitaxial growth on the first n-type region n1. Meanwhile, the second n-type region n2 may be formed, for example, by epitaxial growth on the second p-type region p2.

In a region of the bulk semiconductor substrate 10 in which a field effect transistor is formed, a first conduction type (p-type) well region 51 is formed and a field effect transistor 4 is formed. A gate electrode 53 is formed on the p-type well region 51 of the field effect transistor 4 with a gate insulating film 52 interposed therebetween, and side walls 54 and 55 are formed on the opposite sides of the gate electrode 53. Further, source-drain extension regions 56 and 57 are formed in the p-type well region 51 below the side walls 54 and 55, respectively. Furthermore, a drain region 58 and a source region 59 are formed on the p-type well region 51 on the opposite sides of the gate electrode 53 with the extension regions 56 and 57 interposed therebetween, respectively. The source region 59 is connected to the second n-type region n2 of the thyristor 3 by a wiring line 71. Meanwhile, the drain region 58 has a bit contact formed thereon and connected to a bit line BL.

One storage element 2 of the semiconductor device 1 is formed from the thyristor 3 and the field effect transistor 4. The semiconductor device 1 includes a plurality of such storage elements 2 formed, for example, in a matrix.

Now, the semiconductor device 1 of the first embodiment configured such that a gate electrode 13 of a thyristor and a word line WL (gate electrode 53) of a field effect transistor extend perpendicularly to a bit line BL on the layout is described with reference to FIGS. 1, 2 and 3.

Figure 1:
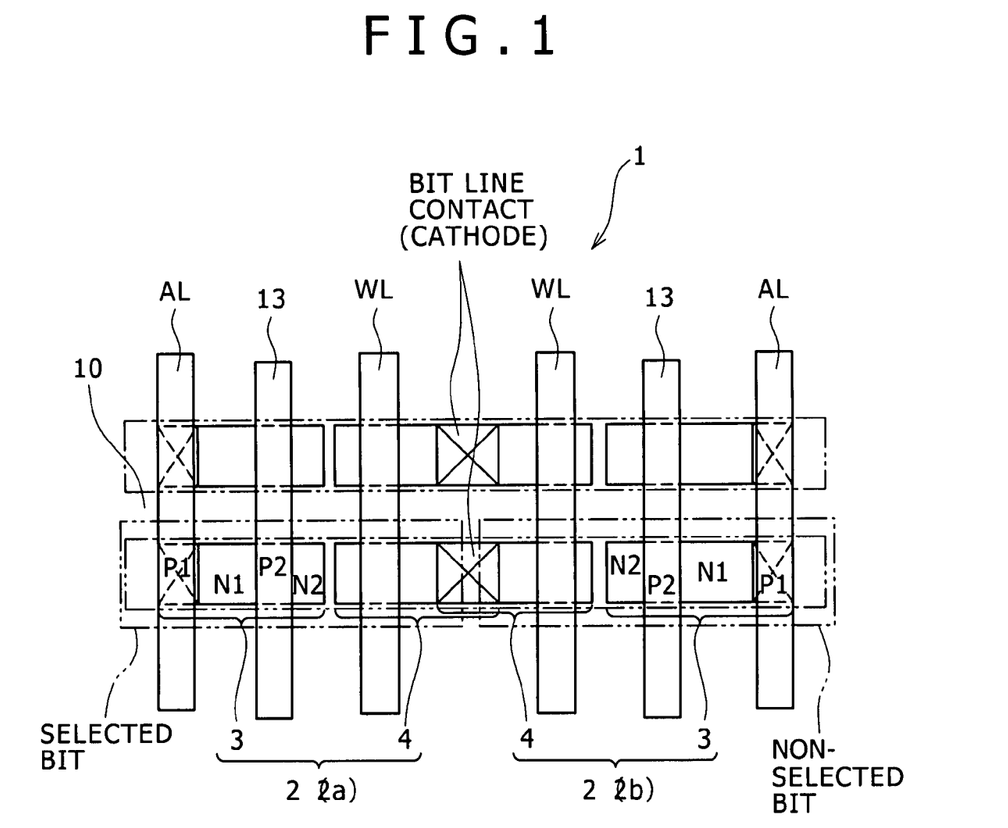
FIG. 1 is a schematic view showing a layout of a semiconductor device to which the present invention is applied.
Figure 2:
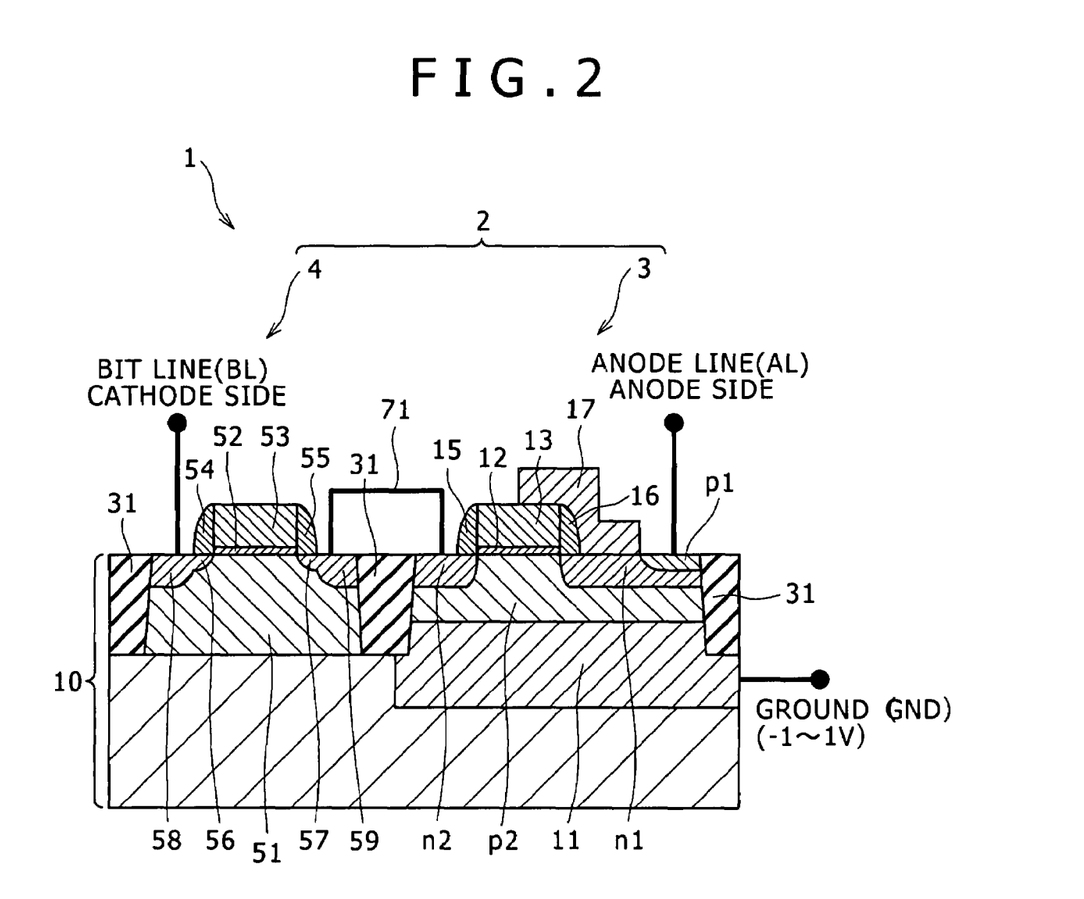
FIG. 2 is a schematic cross sectional view showing an example of a storage element of the semiconductor device.

Referring to FIG. 1, such storage elements 2 as described hereinabove with reference to FIG. 2 are arrayed, for example, in a matrix on the bulk semiconductor substrate 10. It is to be noted that the following description is given under the assumption that one (2a) of two storage elements 2 on the same bit line BL corresponds to a selected bit and the other storage element 2 (2b) corresponds to a non-selected bit.

Figure 3A:
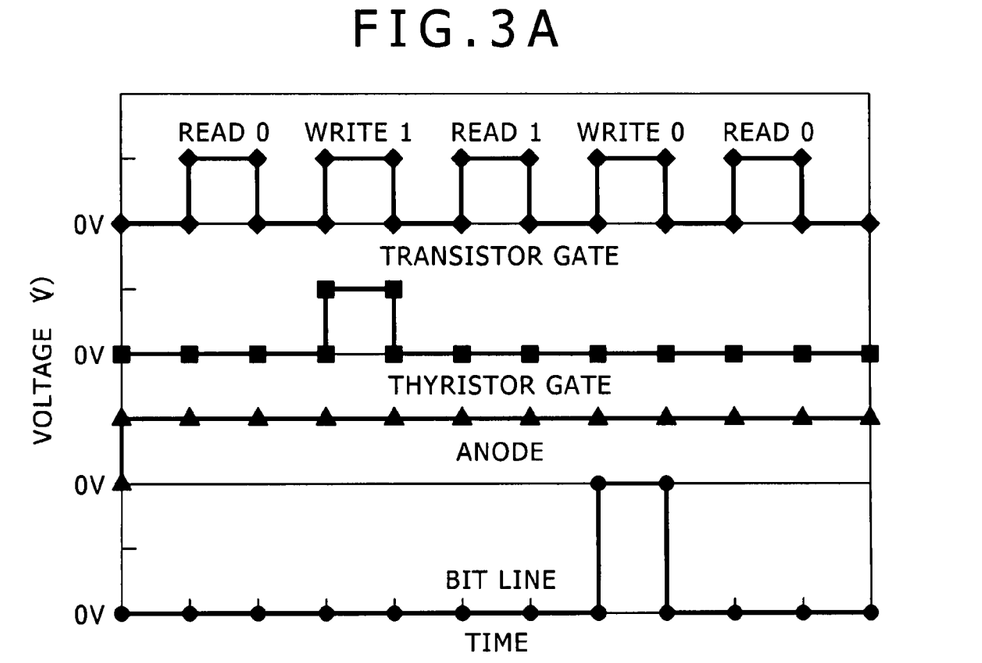
FIGS. 3A and 3B are timing charts of pulses illustrating operation of the semiconductor device.
Figure 3B:
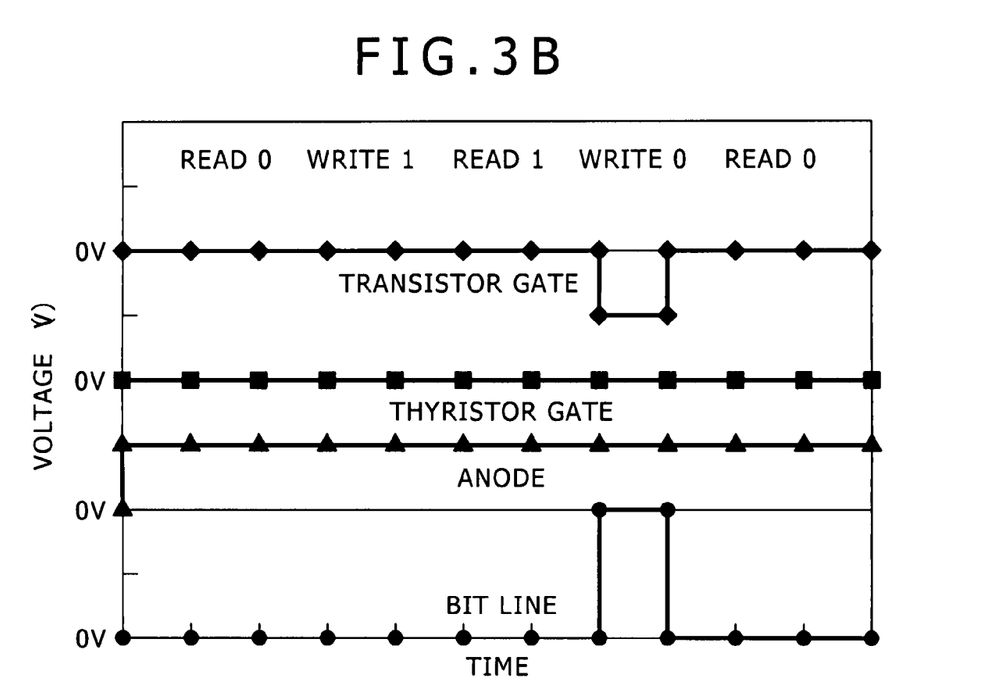

Referring to FIGS. 1 to 3, in order to turn off (WRITE 0) the selected bit of the semiconductor device 1, a first voltage is applied to the first p-type region p1 side of the thyristor 3 of the selected storage element 2 (selected bit) from between the storage elements 2 while a second voltage higher than the first voltage is applied to the cathode side of the field effect transistor 4 of the selected storage element 2. At this time, a voltage lower than the first voltage is applied to the word line WL formed for the field effect transistor 4 of the non-selected storage element 2 existing on the bit line BL on which the selected storage element 2 exits.

In particular, the first p-type region p1 of the storage element 2 which makes the anode side is boosted to the first voltage of, for example, approximately 0.4 to 2 V with respect to the bit line BL (cathode) so that the cathode and the anode may be placed in a reversely biased state. At this time, the voltage of the cathode side, that is, of the bit line BL, is approximately 0.6 to 3 V which is the second voltage higher than the first voltage. The voltage of the bit line BL more preferably is approximately 1.2 V to 1.8 V. At this time, also the word line WL (gate) of the field effect transistor 4a is boosted simultaneously to form a channel. The voltage at this time is approximately 0.5 V to 2 V. This voltage may be any voltage with which a channel is formed and current flows sufficiently.

On the other hand, since a voltage of the same bit line BL is applied to the non-selected storage element 2 (2b) connected to the bit line BL of the same bit, there is the possibility that also the storage element 2b of the non-selected bit may perform a turning off operation (WRITE 0). Therefore, in the present invention, a negative voltage is applied to the word line WLb of the field effect transistor 4 (4b) of the access transistor provided in the storage element 2b of the non-selected bit to place the channel in a fully off state thereby to establish a state wherein no current flows through the channel. By this, flowing out of excessive carriers is prevented, or in other words, excessive carriers are confined, and the cathode of the thyristor 3 (3b) is boosted to a potential equal to that of the bit line BL thereby to prevent appearance of a reversely biased state. As a result, on-information of the thyristor 3 (3b) can be maintained.

Accordingly, there is an advantage that, even if the gate of the thyristor 3 is not used, distinction between the storage element 2a in a selected state and the storage element 2b in a non-selected state upon turning off operation can be made, and disturbance of the bit line BL or the anode side can be prevented and erroneous writing operation into the non-selected storage element 2b can be prevented. Therefore, the semiconductor device 1 has a high degree of reliability.

Now, another semiconductor device 1 (1b) as a second embodiment of the present invention which is configured such that a gate electrode 13 of a thyristor and a word line WL (gate electrode 53) of a field effect transistor extend perpendicularly to an anode line (not shown) on the layout is described with reference to FIGS. 2, 4 and 5.

Figure 4:
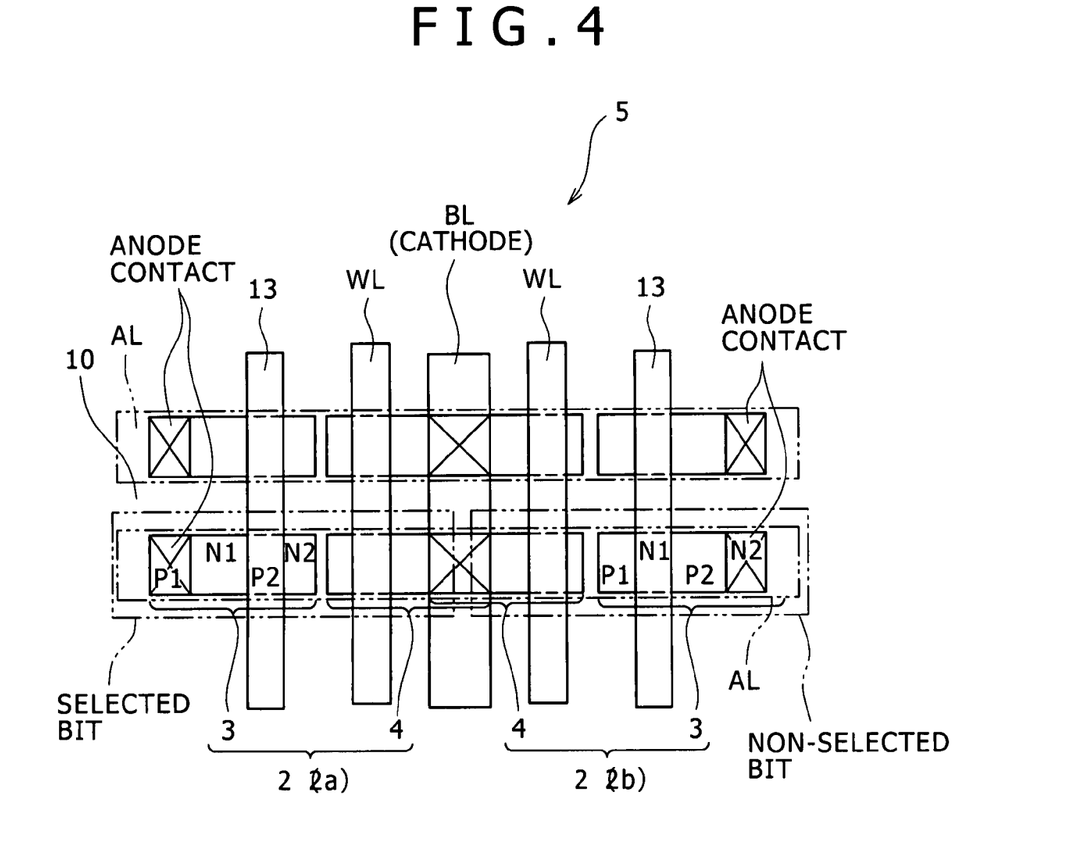
FIG. 4 is a schematic view showing a layout of another semiconductor device to which the present invention is applied.

Referring to FIG. 4, such storage elements 2 as described hereinabove with reference to FIG. 2 are arrayed, for example, in a matrix on the bulk semiconductor substrate 10. The following description is given under the assumption that one of two storage elements 2 on the same bit line BL corresponds to a selected bit and the other storage element 2 corresponds to a non-selected bit.

Figure 5A:
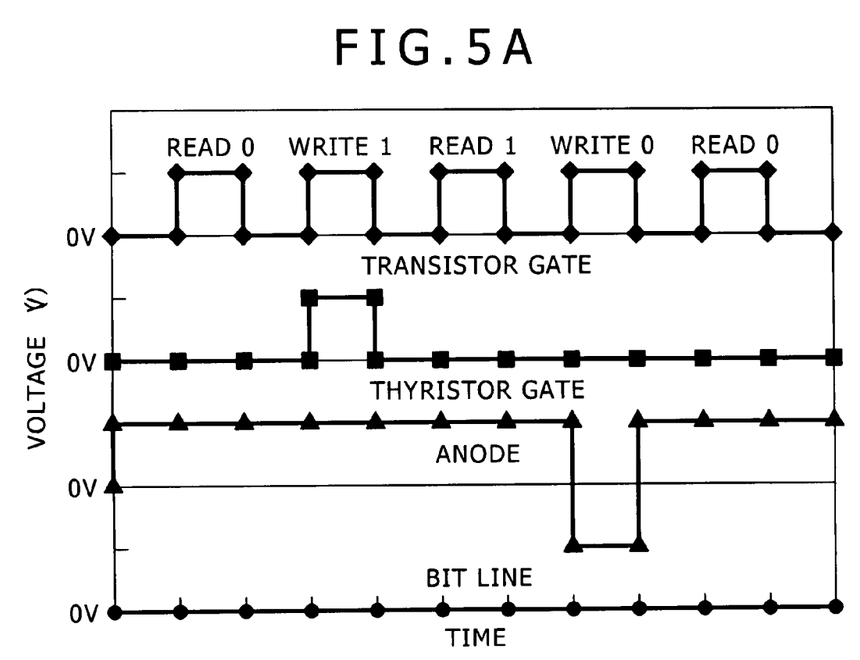
FIGS. 5A and 5B are timing charts of pulses illustrating different operation of the semiconductor device.
Figure 5B:
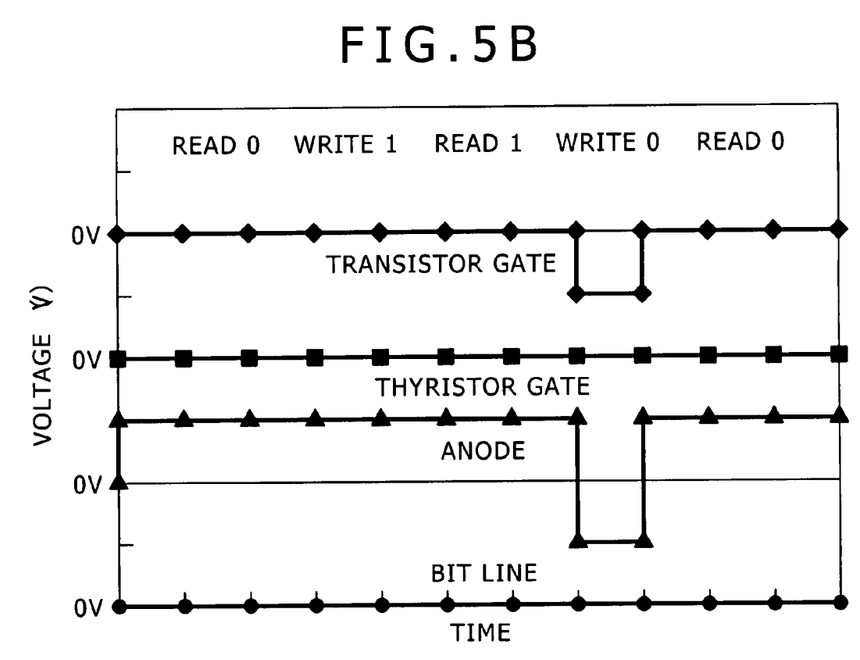

Referring to FIGS. 2, 4 and 5, in order to perform a turning off operation (WRITE 0) of the selected bit of the semiconductor device 5, a first voltage is applied to the first p-type region p1 side of the thyristor 3 of the selected storage element 2 (selected bit) from between the storage elements 2, and a second voltage higher than the first voltage is applied to the cathode side of the field effect transistor 4 of the selected storage element 2. At this time, a voltage lower than the first voltage is applied to the word line WL formed for the field effect transistor 4 of the non-selected storage element 2 which is on the bit line BL same as that of the selected storage element 2 from between the storage elements 2.

In particular, a negative bias lower than 0 V, for example, approximately 0 V to −2 V, is applied to the anode line AL so as to establish a reversely biased state between the cathode and the anode. The anode voltage at this time preferably is approximately 0 V to −1.5 V. At this time, also the word line WL (gate) of the field effect transistor 4a is boosted simultaneously to form a channel. The voltage at this time is approximately 0.5 V to 2 V. This voltage may be any voltage with which a channel is formed and sufficient current flows.

On the other hand, since the voltage of the same anode line AL is applied to the storage element 2 (2b) of the non-selected bit connected to the anode line AL to which the storage element 2 of the selected bit is connected, there is the possibility that also the storage element 2b of the non-selected bit may perform a turning off operation (WRITE 0). Therefore, in the present invention, a negative voltage is applied to the word line WLb of the field effect transistor 4 (4b) of the access transistor provided in the storage element 2b of the non-selected bit to place the channel into a fully off state thereby to establish a state wherein no current flows. By this, flowing out of excessive carriers is prevented, or in other words, excessive carries are confined, and the cathode of the thyristor 3 (3b) is boosted to a potential equal to that of the bit line BL thereby to prevent appearance of a reversely biased state. As a result, on-information of the thyristor 3 (3b) can be maintained.

Accordingly, there is an advantage that, even if the gate of the thyristor 3 is not used, distinction between the storage element 2a in a selected state and the storage element 2b in a non-selected state upon turning off operation can be made, and disturbance of the bit line BL or the anode side can be prevented and erroneous writing operation into the non-selected storage element 2b can be prevented. Therefore, the semiconductor device 5 has a high degree of reliability.

In the first and second embodiments of the present invention described above, a bias may be applied suitably to the well region 11 upon turning off operation. For example, a voltage higher than the first voltage applied to the anode side but lower than the second voltage is applied to the well region 11. By applying an appropriate voltage to the well region 11 in this manner, excessive carriers (electrons) in the second p-type region p2 of the thyristor are swept out to the well region 11 side compulsorily without depending upon the electric field from the gate electrode 13. Consequently, the erasure time can be reduced, and therefore, an off state can be established at a high speed.

The driving method for the semiconductor devices 1 and 5 according to the first and second embodiments described hereinabove can be applied not only to a semiconductor device formed on a semiconductor substrate 10 but also a semiconductor device formed on a SOI (Silicon On Insulator) substrate.

Now, a first example of a method of producing a thyristor region in the semiconductor device of the present invention is described with reference to FIGS. 6A to 6H. This production method is an example of a method of producing the storage element 2 of the semiconductor devices 1 and 5 described hereinabove with reference to FIGS. 1 and 4.

Figure 6A:
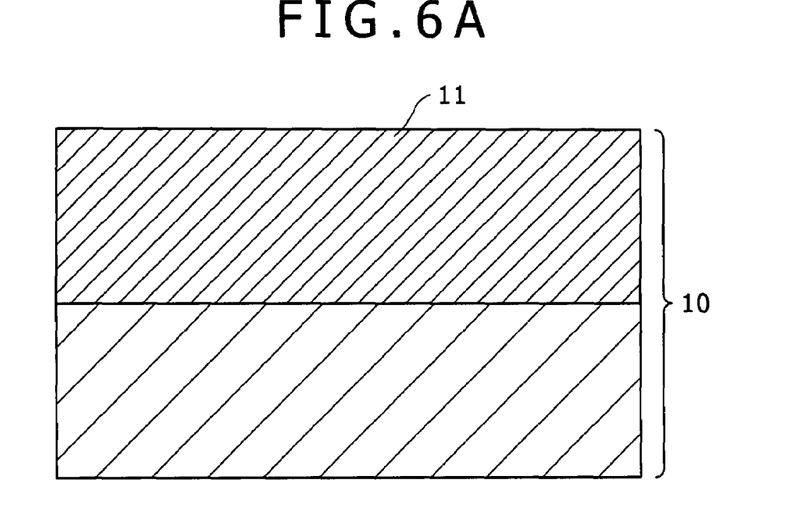
FIGS. 6A to 6H are schematic sectional views illustrating an example of a process of manufacturing a thyristor section of the semiconductor devices of FIGS. 1 and 4.

As seen in FIG. 6A, typically a silicon substrate is used as the bulk semiconductor substrate 10. In particular, for example, a bulk silicon substrate like a CZ silicon wafer is used. An element separation region (not shown) for separating element formation regions from each other, a well region 11 of the second conduction type (n type) of an element formation region and so forth are formed on the bulk semiconductor substrate 10. The well region 11 is formed typically by ion implantation using a mask not shown. The ion implantation concentration in this instance is performed preferably within a range from $1\times10^{16}$ cm$^{-3}$ to $1\times10^{20}$ cm$^{-3}$. More preferably, the ion implantation concentration ranges from approximately $1\times10^{17}$ cm$^{-3}$ to $1\times10^{18}$ cm$^{-3}$. As regards the depthwise direction, the junction to the second p-type region p2 hereinafter described is preferably shallower than the element separation region, and more preferably, the junction is shallower than the element separation region taking the elongation of the depletion layer upon voltage application into consideration. It is to be noted that, in FIGS. 6B to 6H, indication of the bulk semiconductor substrate 10 is omitted.

Figure 6B:
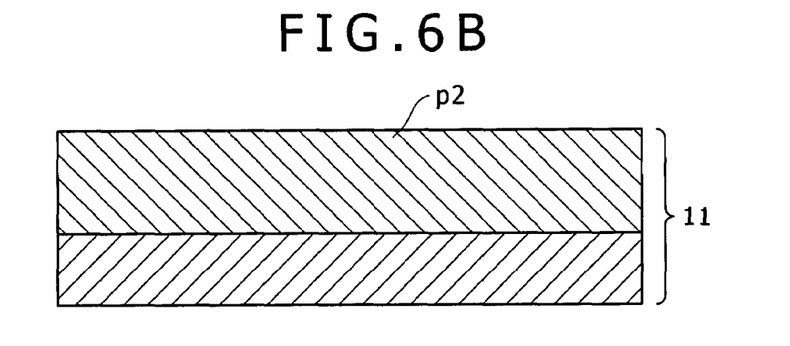

Then, an upper part of the well region 11 is formed in the region of the first conduction type (p type) as seen in FIG. 6B. This p type region makes the second p-type region p2 of a thyristor. In an example of ion implantation conditions in this instance, boron (B) which is a p-type dopant is used as the dopant, and the doze amount is set so that, for example, the dopant concentration becomes $5\times10^{18}$ cm$^{-3}$. This dopant concentration preferably ranges approximately from $1\times10^{18}$ cm$^{-3}$ to $1\times10^{19}$ cm$^{-3}$. However, basically it is necessary for the dopant concentration to be lower than the dopant concentration of the first n-type region of the second conduction type (n type) which is formed later. For the p-type dopant, not only boron (B) but also another p-type region such as indium (In) can be used.

Figure 6C:
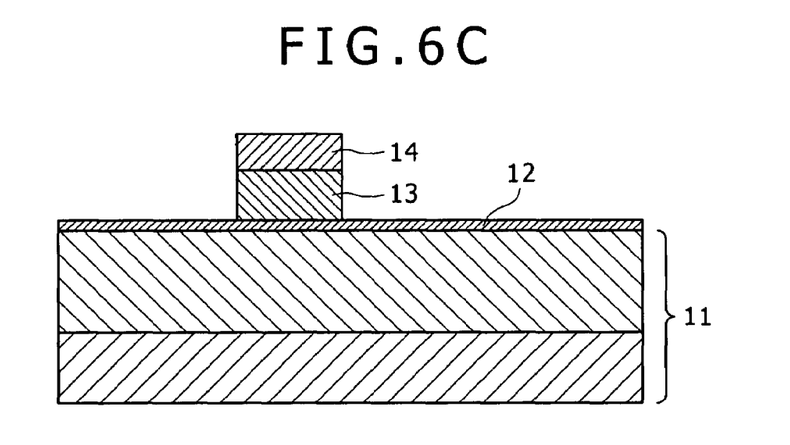

Thereafter, a gate insulating film 12 is formed on the well region 11 as seen in FIG. 6C. The gate insulating film 12 is formed, for example, from a silicon oxide ($SiO_2$) film in a thickness of approximately 1 nm to 10 nm. It is to be noted that the gate insulating film 12 may not only be formed from silicon oxide ($SiO_2$) but also may be made of silicon nitride oxide (SiON) or any gate insulating film material which can be applied to ordinary CMOS transistors such as hafnium oxide ($HfO_2$), hafnium nitride oxide (HfON), aluminum oxide ($Al_2O_3$), hafnium silicate (HfSiO), hafnium nitride silicate (HfSiON) and lanthanum oxide ($La_2O_3$). Further, a gate insulating film 12 of a field effect transistor (refer to FIG. 2) to serve as a selected transistor can be formed from the gate insulating film 12. Further, the gate electrode of a field effect transistor (refer to FIG. 2) can be formed at the step of forming the gate electrode 13.

Then, a gate electrode 13 is formed on the gate insulating film 12 above a region makes the second p-type region p2. The gate electrode 13 is normally formed from polycrystalline silicon. Alternatively, also it is possible to form the gate insulating film 12 as a metal gate electrode or form the gate insulating film 12 from silicon germanium (SiGe).

The gate electrode 13 is formed, for example, by formation of a gate electrode formation film on the gate insulating film 12 and etching of the gate electrode formation film by an etching technique which includes ordinary application of a resist, formation of an etching mask by a lithography technique and etching using the etching mask. An ordinary dry etching technique can be used as the etching technique in this instance. Also it is possible to form the gate electrode 13 alternatively by wet etching. Further, a silicon oxide ($SiO_2$) film, a silicon nitride ($Si_3N_4$) film or a like film may be formed as a hard mask 14 on the gate electrode formation film.

Figure 6D:
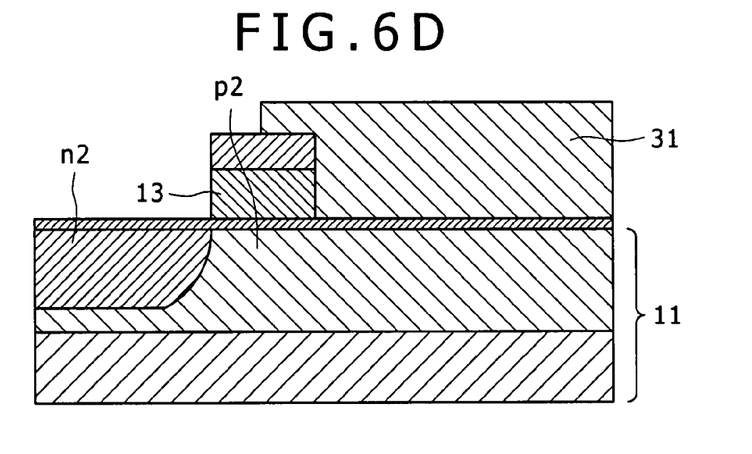

Then, an ion implantation mask 31 is formed by an ordinary resist application and lithography technique such that it is open on one side of the gate electrode 13, that is, on a region on which the second n type region is to be formed as seen in FIG. 6D. Thereafter, an n-type dopant is introduced into the second p-type region p2 formed in the well region 11 on the one side of the gate electrode 13 by ion implantation using the ion implantation mask 31 to form a second n-type region n2.

The ion implantation conditions are set such that, for example, phosphorus (P) is used as the dopant and the doze amount is set so that the dopant concentration may become, for example, $1\times10^{19}$ cm$^{-3}$. Although the dopant concentration preferably is approximately $1\times10^{18}$ cm$^{-3}$ to $1\times10^{21}$ cm$^{-3}$, it is necessary for the dopant concentration to be higher than the dopant concentration of the second p-type region p2. Further, in place of phosphorus, another n-type dopant such as gallium, arsenic or antimony can be used. Thereafter, the ion implantation mask 31 is removed.

Thereafter, spike annealing, for example, at 1,050° C. for 0.1 second is carried out as annealing for activation. The conditions in this instance may be within a range within which activation of the dopant can be carried out.

Figure 6E:
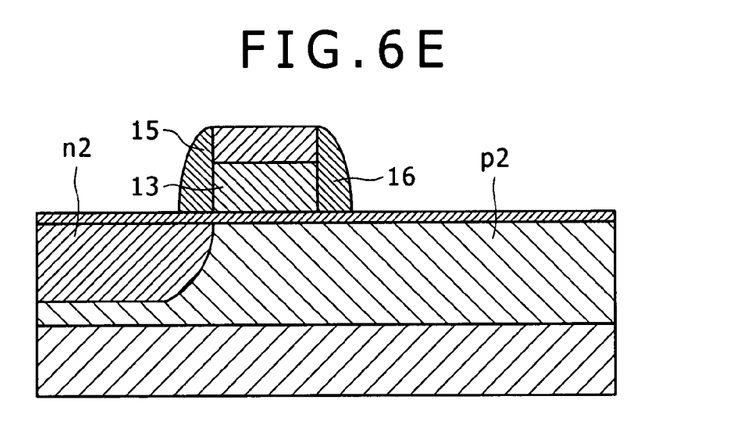

Then, side walls 15 and 16 are formed on the opposite sides of the gate electrode 13 as seen in FIG. 6E. The side walls 15 and 16 can be formed, for example, by forming a side wall formation film so as to cover the gate electrode 13 and then etching back the side wall formation film. The side walls 15 and 16 may be formed from any of silicon oxide ($SiO_2$) and silicon nitride ($Si_3N_4$) or may be formed as a lamination film of the substances. Further, the formation of the side walls may be performed prior to the ion implantation step of forming the second n-type region to be formed later. It is to be noted that the film thickness of the side walls 15 and 16 is set so that the junction between the second p-type region p2 and the first n-type region to be formed later may be formed between the gate electrode 13 and the second gate electrode (not shown) when the second gate electrode is formed on the first n-type region. By this setting, a sufficient effect of the formation of the second gate electrode is achieved. Further, at the step of forming the side walls 15 and 16, a side wall of the field effect transistor (refer to FIG. 2) may be formed.

Figure 6F:
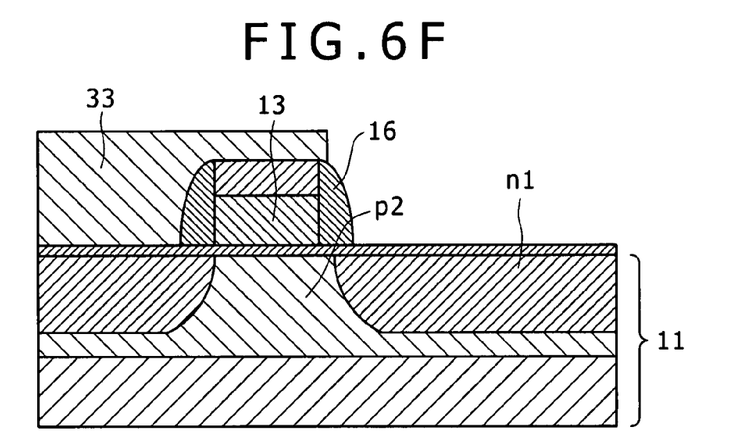

Then, an ion implantation mask 33 is formed by an ordinary resist application and lithography technique such that it is open on the other side of the gate electrode 13, that is, on a region on which the first n-type region is to be formed as seen in FIG. 6F. Then, a dopant of the second conduction type (n type) is introduced into the second p-type region p2 formed on the well region 11 through the side wall 15 on the other side of the gate electrode 13 by an ion implantation technique using the ion implantation mask 33 to form the first n-type region n1 of the second conduction type (n type). The ion implantation conditions in this instance are such that, for example, phosphorus (P) is used as the dopant and the doze amount is set so that the dopant concentration becomes, for example, $1.5 \times 10^{19}$ $cm^{-3}$. While the dopant concentration preferably is within a range from approximately $1 \times 10^{18}$ $cm^{-3}$ to $1 \times 10^{21}$ $cm^{-3}$, it is necessary for the dopant concentration to be higher than the dopant concentration of the second p-type region p2 described hereinabove. Further, in place of phosphorus, another n-type dopant such as gallium, arsenic or antimony may be used. Thereafter, the ion implantation mask 33 is removed.

Thereafter, spike annealing, for example, at 1,050° C. for 0.1 second is carried out as annealing for activation. The conditions in this instance may be within a range within which activation of the dopant can be carried out.

Figure 6G:
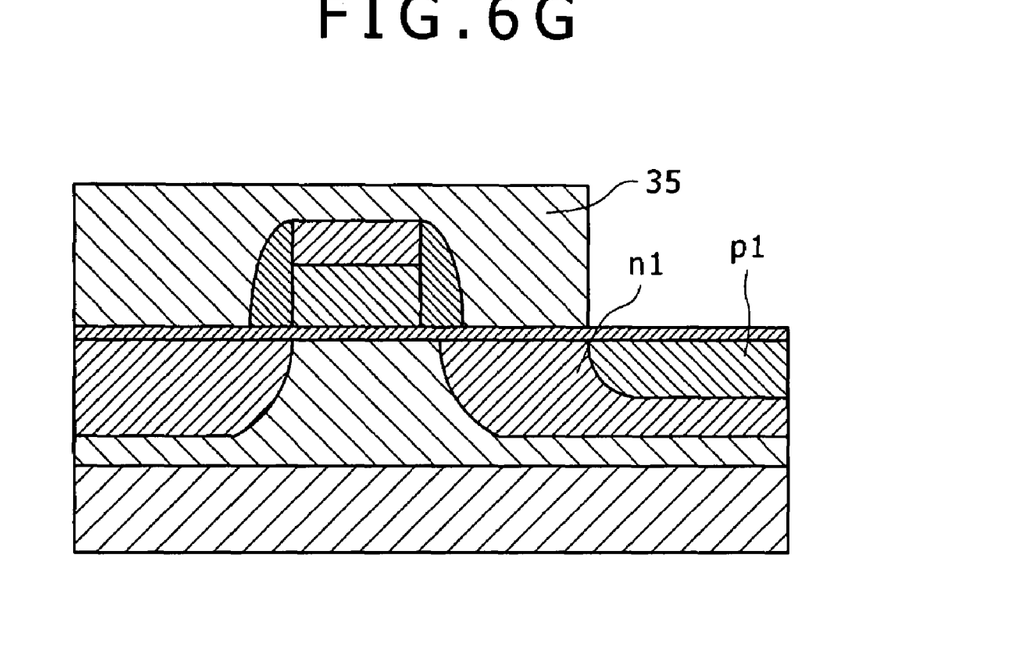

Then, an ion implantation mask 35 is formed by an ordinary resist application and lithography technique such that it is open on a region of the first p-type region n1 on which the first p-type region is to be formed as seen in FIG. 6G. Thereafter, a p-type dopant is introduced into an upper layer of part of the first p-type region n1 by ion implantation using the ion implantation mask 35 to form a first p-type region p1. The ion implantation conditions are set such that, for example, boron (B) is used as the dopant and the doze amount is set so that the dopant concentration may become, for example, $1 \times 10^{20}$ $cm^{-3}$. Although the dopant concentration preferably is approximately $1 \times 10^{18}$ $cm^{-3}$ to $1 \times 10^{21}$ $cm^{-3}$, it is necessary for the dopant concentration to be higher than the dopant concentration of the first n-type region n1. Further, the side wall may be formed in prior to the ion implantation, and the dopant may be a p-type impurity such as indium (In) or aluminum (Al). Thereafter, the ion implantation mask 35 is removed.

Thereafter, spike annealing, for example, at 1,050° C. for 0.1 second is carried out as annealing for activation. The conditions in this instance may be within a range within which activation of the dopant can be carried out.

Figure 6H:
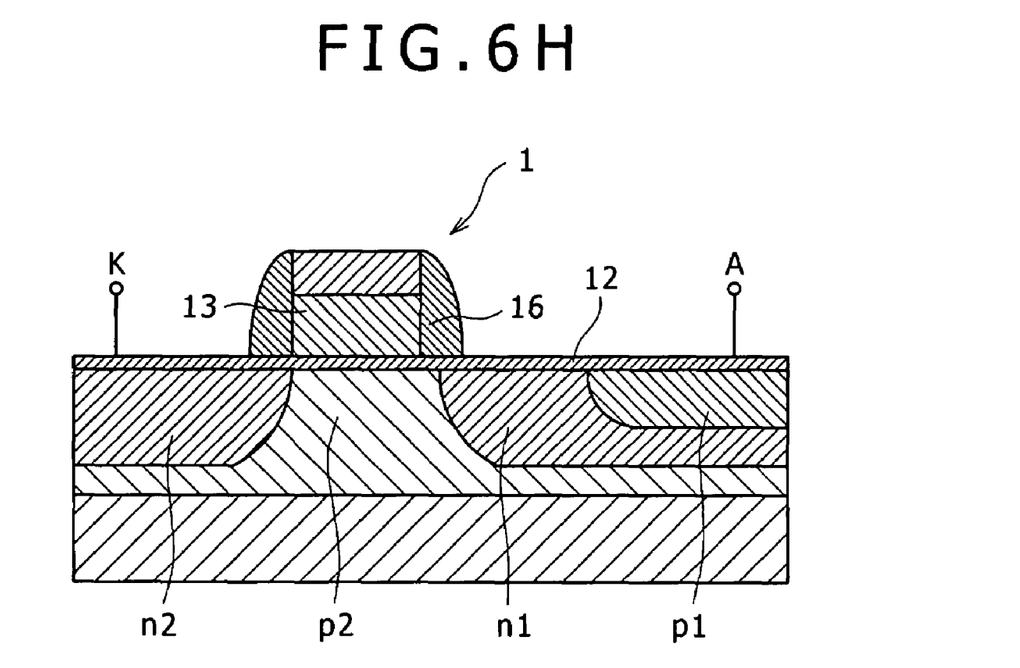

Thereafter, an anode electrode A connected to the first p-type region p1 and a cathode electrode K connected to the second n-type region n2 are formed as seen in FIG. 6H by an ordinary electrode formation technique. Thereupon, silicide (TiSi, CoSi, NiSi or the like) is preferably formed at exposed portions of the first p-type region p1 and the second n-type region n2 at the opposite end portions. In this instance, a salicide block should be formed as seen in FIG. 1 using the mask used for the side wall formation. Thereafter, a wiring step similar to that in an ordinary CMOS step is performed.

In the production process described above, the extension regions of the field effect transistor (refer to FIG. 2) are formed typically by ion implantation after a mask which is open on an extension region is formed from a resist film before a side wall is formed after a gate electrode is formed. Thereafter, the resist mask is removed. Further, formation of a source region and a drain region is performed typically by ion implantation after a mask which is open on the source region and the drain region is formed, for example, using a resist mask after a side wall is formed. Thereafter, the resist mask is removed.

While preferred embodiments of the present invention have been described using specific terms, such description is for illustrative purpose only, and it is to be understood that changes and variations may be made without departing from the spirit or scope of the following claims.

What is claimed is:

1. A semiconductor device, comprising:
   a bulk semiconductor substrate;
   a plurality of storage elements formed on said bulk semiconductor substrate and each including a thyristor formed on said bulk semiconductor substrate and including a first region of a first conductor type, a second region of a second conduction type opposite to the first conduction type, a third region of the first conduction type and a fourth region of the second conduction type jointed together in order, a gate electrode formed on the third region, and a field effect transistor formed on said semiconductor substrate on which said thyristor is formed and connected to said fourth region of said thyristor; and
   a bit line connected to the cathode of said field effect transistor;
   a first voltage being applied, upon turning off operation of a selected one of said storage elements, to the first region side of said thyristor of the selected storage element while a second voltage higher than the first voltage is applied to the cathode side of said field effect transistor of the selected storage element;
   a voltage lower than the first voltage being applied to a word line formed for said field effect transistor of a non-selected one of the storage elements connected to the bit line connected to the selected storage element.

2. The semiconductor device according to claim 1, wherein the first voltage is a positive voltage, and the word line formed for said field effect transistor of the non-selected storage element is in an on state.

3. The semiconductor device according to claim 1, wherein a negative voltage is applied to the word line formed for said field effect transistor of the non-selected storage element.

4. The semiconductor device according to claim 1, wherein a well region of the second conduction type is formed on said bulk semiconductor substrate on which the third region is formed, and a voltage lower than the second voltage is applied to the well region.

5. A driving method for a semiconductor device which includes a bulk semiconductor substrate and a plurality of storage elements formed on said bulk semiconductor substrate and each including a thyristor formed on said bulk semiconductor substrate and including a first region of a first conductor type, a second region of a second conduction type opposite to the first conduction type, a third region of the first conduction type and a fourth region of the second conduction type jointed together in order, a gate electrode formed on the third region, and a field effect transistor formed on said semiconductor substrate on which said thyristor is formed and connected to said fourth region of said thyristor, comprising the steps of:

a bit line being connected to the cathode of said field effect transistor;

applying, upon turning off operation of a selected one of said storage elements, a first voltage to the first region side of said thyristor of the selected storage element while a second voltage higher than the first voltage is applied to the cathode side of said field effect transistor of the selected storage element; and applying a voltage lower than the first voltage to a word line formed for said field effect transistor of a non-selected one of the storage elements connected to the bit line connected to the selected storage element.

6. The driving method for the semiconductor device according to claim 5, wherein the first voltage is set to a positive voltage, and the word line formed for said field effect transistor of the non-selected storage element is placed into an on state.

7. The driving method for the semiconductor device according to claim 5, wherein a negative voltage is applied to the word line formed for said field effect transistor of the non-selected storage element.

8. The driving method for the semiconductor device according to claim 5, wherein a well region of the second conduction type is formed on said bulk semiconductor substrate on which the third region is formed, and a voltage lower than the second voltage is applied to the well region.

* * * * *